US009559278B2

(12) United States Patent
Oh et al.

(10) Patent No.: US 9,559,278 B2
(45) Date of Patent: Jan. 31, 2017

(54) LIGHT EMITTING DEVICE PACKAGE

(71) Applicant: LG INNOTEK CO., LTD., Seoul (KR)

(72) Inventors: Sung Joo Oh, Seoul (KR); Keal Doo Moon, Seoul (KR); Dong Yong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/724,090

(22) Filed: May 28, 2015

(65) Prior Publication Data
US 2015/0349225 A1 Dec. 3, 2015

(30) Foreign Application Priority Data

May 29, 2014 (KR) .................. 10-2014-0064874
Aug. 22, 2014 (KR) .................. 10-2014-0109575

(51) Int. Cl.
*H01L 33/00* (2010.01)
*H01L 33/62* (2010.01)
(Continued)

(52) U.S. Cl.
CPC ............... *H01L 33/62* (2013.01); *H01L 24/14* (2013.01); *H01L 24/16* (2013.01); *H01L 24/17* (2013.01); *H01L 33/38* (2013.01); *H01L 24/13* (2013.01); *H01L 24/81* (2013.01); *H01L 33/486* (2013.01); *H01L 33/647* (2013.01); *H01L 2224/06102* (2013.01); *H01L 2224/131* (2013.01); *H01L 2224/133* (2013.01); *H01L 2224/13017* (2013.01); *H01L 2224/13139* (2013.01); *H01L 2224/13144* (2013.01); *H01L 2224/13294* (2013.01); *H01L 2224/1403* (2013.01); *H01L 2224/16058* (2013.01); *H01L 2224/16227* (2013.01); *H01L 2224/16245* (2013.01); *H01L 2224/1703* (2013.01);
(Continued)

(58) Field of Classification Search
CPC .......... H01L 33/62; H01L 24/16; H01L 24/17; H01L 24/14; H01L 33/38; H01L 2224/13017; H01L 2224/81439; H01L 2224/13139; H01L 2224/16058; H01L 24/13; H01L 2224/16245; H01L 2224/131; H01L 2224/1703; H01L 2224/16227; H01L 2224/17051; H01L 2224/13294; H01L 2224/81815; H01L 2224/1403; H01L 2224/13144; H01L 2224/133; H01L 2224/06102; H01L 2224/81193; H01L 33/647; H01L 2933/0066; H01L 33/486; H01L 2924/12041; H01L 24/81

See application file for complete search history.

(56) References Cited

U.S. PATENT DOCUMENTS 6,369,451 B2    4/2002  Lin
7,642,128 B1 *  1/2010  Lin .................... H01L 21/6835
                                                          257/E21.508

(Continued)

*Primary Examiner* — Victor A Mandala
(74) *Attorney, Agent, or Firm* — Birch, Stewart, Kolasch & Birch, LLP

(57) ABSTRACT

Embodiments provide light emitting device package including a package body, a first lead frame and a second lead frame disposed on the package body, and a light emitting device electrically connected to the first lead frame and the second lead frame via respective conductive adhesives. At least one of the conductive adhesives has the smallest width at a central region thereof.

19 Claims, 9 Drawing Sheets

(51) Int. Cl.
*H01L 33/38* (2010.01)
*H01L 23/00* (2006.01)
*H01L 33/48* (2010.01)
*H01L 33/64* (2010.01)

(52) U.S. Cl.
CPC ............... *H01L 2224/17051* (2013.01); *H01L 2224/81193* (2013.01); *H01L 2224/81439* (2013.01); *H01L 2224/81815* (2013.01); *H01L 2924/12041* (2013.01); *H01L 2933/0066* (2013.01)

(56) References Cited

U.S. PATENT DOCUMENTS

| | | | |
|---|---|---|---|
| 7,732,831 B2 * | 6/2010 | Takeuchi | H01L 33/0079 257/103 |
| 9,318,674 B2 * | 4/2016 | Hussell | H01L 33/62 |
| 2003/0224197 A1 | 12/2003 | Soga et al. | |
| 2007/0026568 A1 | 2/2007 | Beyne | |
| 2007/0176186 A1 * | 8/2007 | Lin | H01L 33/60 257/79 |
| 2009/0146298 A1 | 6/2009 | Masumoto | |
| 2009/0200663 A1 | 8/2009 | Daubenspeck et al. | |
| 2011/0117700 A1 * | 5/2011 | Weng | H01L 21/56 438/109 |
| 2013/0049039 A1 | 2/2013 | Vadhavkar | |
| 2015/0155426 A1 * | 6/2015 | Jeon | H01L 33/46 438/29 |
| 2015/0259194 A1 * | 9/2015 | Lin | B81B 7/007 257/773 |

\* cited by examiner

LIGHT EMITTING DEVICE PACKAGE

CROSS REFERENCE TO RELATED APPLICATION

This application claims priority under 35 U.S.C. §119 to Korean Patent Application No. 10-2014-0064874, filed in Korea on 29 May, 2014 and No. 10-2014-0109575, filed in Korea on, 22 Aug. 2014, which are hereby incorporated in its entirety by reference as if fully set forth herein.

TECHNICAL FIELD

Embodiments relate to a light emitting device package and, more particularly, improvement of reliability upon bonding of a light emitting device inside a package.

BACKGROUND

Group III-V compound semiconductors such as, for example, GaN and AlGaN are widely used for optoelectronics and electronics because of many advantages such as, for example, easily controllable wide band gap energy.

In particular, light emitting devices, such as light emitting diodes or laser diodes, which use group III-V or II-VI compound semiconductors, are capable of emitting visible and ultraviolet light of various colors such as red, green, and blue owing to development of device materials and thin film growth techniques. These light emitting devices are also capable of emitting white light with high luminous efficacy through use of a fluorescent substance or color combination and have several advantages of low power consumption, semi-permanent lifespan, fast response speed, safety, and environmental friendliness as compared to conventional light sources such as, for example, fluorescent lamps and incandescent lamps.

Accordingly, application sectors of the light emitting devices are expanded up to transmission modules of optical communication means, light emitting diode backlights to replace Cold Cathode Fluorescence Lamps (CCFLs) which serve as backlights of Liquid Crystal Display (LCD) apparatuses, white light emitting diode lighting apparatus to replace fluorescent lamps or incandescent lamps, vehicular headlamp, and traffic lights.

FIG. 1 is a view illustrating a conventional light emitting device package, and FIG. 2 is a view illustrating the shape of a solder in detail.

The conventional light emitting device package 100 includes a first lead frame 120a and a second lead frame 120b disposed on a sub-mount 110, and a light emitting device 140 is electrically coupled to the first lead frame 120a and the second lead frame 120b via solders 150a and 150b.

The light emitting device 140 includes a substrate 141 and an underlying light emitting structure 142 including a first conductive semiconductor layer 142a, an active layer 142b, and a second conductive semiconductor layer 142c. The light emitting device 140 further includes a first electrode 144a disposed beneath one side of a lower surface of the first conductive semiconductor layer 142a and a second electrode 144b disposed beneath a lower surface of the second conductive semiconductor layer 142c, the first electrode 144a and the second electrode 144b being electrically connected to the first lead frame 120a and the second lead frame 120b respectively.

In the light emitting device package 100 as described above, the solders 150a and 150b are used for electrical connection between the light emitting device 140 and the first and second lead frames 120a and 120b. There may occur stress due to a difference between thermal expansion coefficients of different kinds of materials and, consequently, this stress may have a negative effect on the quality of the light emitting structure 142.

Since a height $h_{o1}$ of the light emitting device 140 is within a range of about 100 μm to 200 μM and a height $h_{o2}$ of the solders 150a and 150b is within about 30 μm, there is sufficient probability that the stress is transferred to the light emitting device 140 through the solders 150a and 150b.

In addition, in a manufacturing process of the light emitting device package 100, after the solders 150a and 150b are applied to the respective lead frames 120a and 120b, the electrodes 144a and 144b of the light emitting device 140 are attached to the solders 150a and 150b. At this time, as exemplarily illustrated in FIG. 2, voids may be generated in an upper region of the solder 150b bonded to the second electrode 144b of the light emitting device 140.

The voids as described above may be generated while an interface between the solder 150b and the second electrode 144b is cooled in a heat treatment process for the solder 150b. Such void generation may result in defective electrical connection between the second lead frame 120b and the second electrode 144b of the light emitting device 140 or may prevent uniform light distribution throughout the light emitting device package 100.

In addition, the solder disposed between the electrode of the light emitting device and the lead frame may cause the light emitting device to deviate from a fixed position thereof during implementation of a reflow process. Moreover, when the solder is applied to a reflective layer disposed on the sub-mount to reflect light emitted from the light emitting device, light loss of the light emitting device package may occur.

SUMMARY

Embodiments provide a light emitting device package which is capable of improving reliability of electrical connection between a lead frame and a light emitting device and achieving uniform light distribution.

In one embodiment, a light emitting device package includes a package body, a first lead frame and a second lead frame disposed on the package body, and a light emitting device electrically connected to the first lead frame and the second lead frame via respective conductive adhesives, wherein at least one of the conductive adhesives has the smallest width at a central region thereof.

Each of the conductive adhesives may be divided into a first portion and a second portion, and the central region is disposed between the first portion and the second portion.

An end of the first portion of the conductive adhesive may contact with one of the first lead frame and the second lead frame and an end of the second portion of the conductive adhesive may contact with a first electrode or a second electrode of the light emitting device.

The first portion may have a higher height than a height of the second portion.

The end of the first portion of the conductive adhesive contacting with one of the first lead frame and the second lead frame may have a greater width than a width of the end of the second portion contacting with the first electrode or the second electrode of the light emitting device.

The end of the first portion of the conductive adhesive contacting with one of the first lead frame and the second lead frame may have a smaller width than a width of a central region of the first portion of the conductive adhesive.

The end of the first portion of the conductive adhesive contacting with one of the first lead frame and the second lead frame may have a greater width than a width of the central region of the conductive adhesive.

The end of the second portion of the conductive adhesive contacting with one of the first electrode and the second electrode may have a smaller width than a width of a central region of the second portion of the conductive adhesive.

The end of the second portion of the conductive adhesive contacting with one of the first electrode and the second electrode may have a greater width than a width of the central region of the conductive adhesive.

The central region may be a coupling interface of the first portion and the second portion.

The central region may be a void free region.

In another embodiment, a light emitting device package includes a package body including a cavity and at least one recess formed in the bottom of the cavity, a light emitting device disposed on the recess, a first lead frame and a second lead frame spaced apart from each other in the horizontal direction different from the thickness direction of the package body in the recess, and a conductive adhesive disposed between the light emitting device and the first lead frame and the second lead frame, wherein the cavity includes a first bottom surface provided with the recess and a second bottom surface adjacent to the first bottom surface, and wherein the conductive adhesive is disposed on the first bottom surface.

The recess may have a first width in the horizontal direction and the first width may be 0.9 times or more and 1.1 times or less of a second width of the light emitting device in the horizontal direction.

The first lead frame and the second lead frame may penetrate the package body in the thickness direction and be exposed from the first bottom surface.

The first lead frame and the second lead frame may be horizontally spaced apart from a boundary between the first bottom surface and the second bottom surface to thereby be exposed.

The exposed first and second lead frames may contact with a boundary between the first bottom surface and the second bottom surface.

The first bottom surface may have a first region disposed between the first lead frame and the second lead frame and a second region for exposure of the first and second lead frames, and the first region may protrude than the second region.

The recess may have a smaller width than a width of the light emitting device.

The recess may have a greater width than a width of the light emitting device.

In a further embodiment, a light emitting device package includes a package body including a cavity and at least one recess formed in the bottom of the cavity, a light emitting device disposed on the recess, a first lead frame and a second lead frame spaced apart from each other in the horizontal direction different from the thickness direction of the package body in the recess, and conductive adhesives disposed between the light emitting device and the first lead frame and the second lead frame, wherein each of the conductive adhesives has a central region and is divided into a first portion and a second portion with the central region disposed therebetween, and wherein at least one of the conductive adhesives has the smallest width at the central region thereof.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, exemplary embodiments to concretely realize the above objects will be described in detail with reference to the accompanying drawings.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

In embodiments, when a light emitting device is bonded to a lead frame within a light emitting device package, conductive adhesives are applied respectively to the light emitting device and the lead frame and, subsequently, the light emitting device and the lead frame are coupled to each other, which serves to prevent stress caused by a difference between thermal expansion coefficients from being transferred to a light emitting structure and to remove voids at an interface between the light emitting device and the lead frame.

Figure 1:
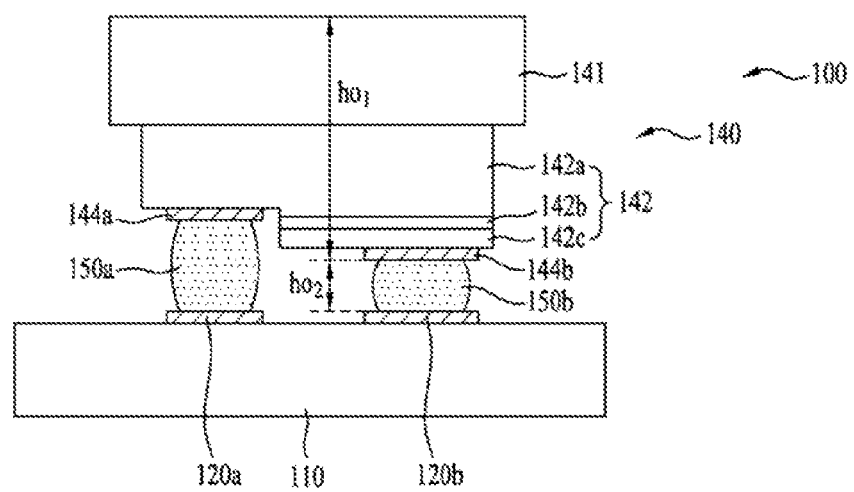
FIG. 1 is a view illustrating a conventional light emitting device package.
Figure 2:
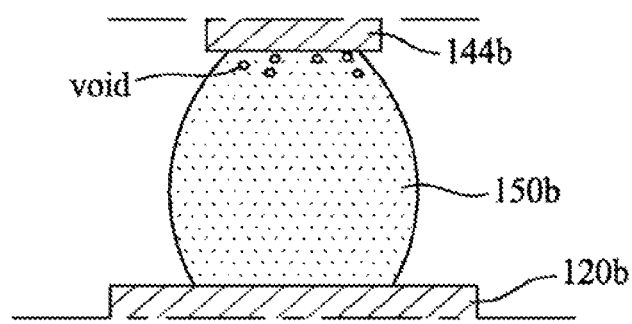
FIG. 2 is a view illustrating the shape of a solder of FIG. 1 in detail.
Figure 3:
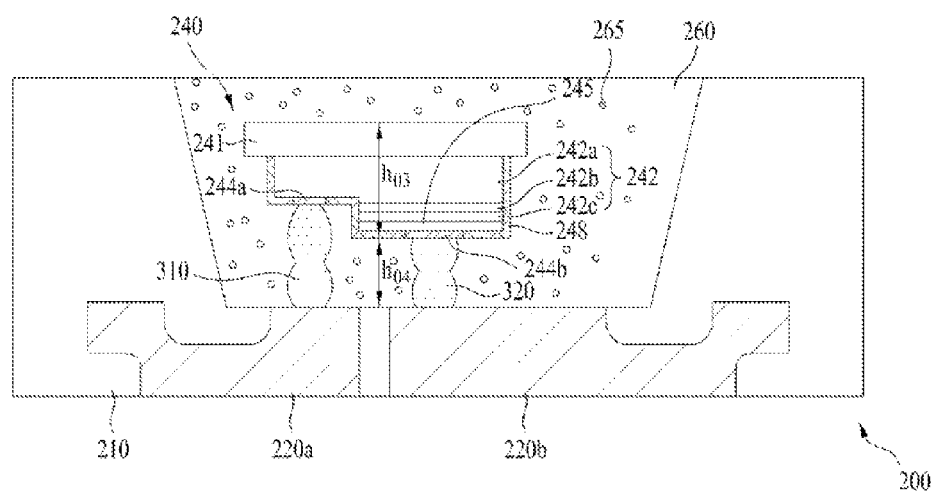
FIG. 3 is a view illustrating one embodiment of a light emitting device package.

FIG. 3 is a view illustrating one embodiment of a light emitting device package.

The light emitting device package as exemplarily illustrated in FIG. 3, designated by reference numeral 200, includes a package body 210 having a cavity, a first lead frame 220a and a second lead frame 220b disposed in the package body 210, a light emitting device 240 disposed in the package body 210 and electrically connected to the first lead frame 220a and the second lead frame 220b via conductive adhesives 310 and 320, and a molding part 260 received in the cavity to surround the light emitting device 240.

The package body 210 may be formed of a silicon material, or may be formed of a synthetic resin material or a metal material. When the package body 210 is formed of a conductive material such as, for example, a metal material, although not illustrated, an insulation layer may be coated over the surface of the package body 210 to prevent electrical short-circuit between the first and second lead frames 220a and 220b.

The cavity may be defined in the package body 210 and include a bottom surface, on which the light emitting device 240 is disposed, and a sidewall having a predetermined gradient relative to the bottom surface.

The first lead frame 220a and the second lead frame 220b are disposed in the package body 210 so as to be electrically separated from each other and portions of the first lead frame 220a and the second lead frame 220b are exposed from the bottom surface of the cavity. The first lead frame 220a and the second lead frame 220b serve to supply current to the light emitting device 240. In addition, the first lead frame 220a and the second lead frame 220b are capable of increasing luminous efficacy by reflecting light emitted from the light emitting device 240 and outwardly radiating heat generated in the light emitting device 240.

In addition, surfaces of the first and second lead frames 220a and 220b may be coated with, for example, silver (Ag) having excellent reflectivity, which may improve light extraction efficiency of the light emitting device package 200.

The light emitting device 240 is a flip chip type light emitting device and includes a light emitting structure 242 disposed on a substrate 241, the light emitting structure 242 including a first conductive semiconductor layer 242a, an active layer 242b, and a second conductive semiconductor layer 242c.

The substrate 241 may be formed of a material suitable for semiconductor material growth, or a carrier wafer. The substrate 241 may be formed of a highly thermally conductive material and include a conductive substrate or an insulation substrate. For example, the substrate 241 may utilize at least one of sapphire ($Al_2O_3$), $SiO_2$, SiC, Si, GaAs, GaN, ZnO, GaP, InP, Ge, and $Ga_2O_3$.

The first conductive semiconductor layer 242a may be formed of a compound semiconductor such as, for example, a group III-V or II-VI compound semiconductor and may be doped with a first conductive dopant. The first conductive semiconductor layer 242a may be formed of a semiconductor material having a composition of $Al_xIn_yGa_{(1-x-y)}N$ ($0 \leq x \leq 1$, $0 \leq y \leq 1$, $0 \leq x+y \leq 1$), i.e. any one or more materials selected from among AlGaN, GaN, InAlGaN, AlGaAs, GaP, GaAs, GaAsP, and AlGaInP.

When the first conductive semiconductor layer 242a is an n-type semiconductor layer, the first conductive dopant may include an n-type dopant such as Si, Ge, Sn, Se, and Te. The first conductive semiconductor layer 242a may have a single layer or multi-layer form, without being limited thereto.

The active layer 242b is disposed between the first conductive semiconductor layer 242a and the second conductive semiconductor layer 242c and may include any one of a single-well structure, a multi-well structure, a single-quantum well structure, a multi-quantum well structure, a quantum dot structure and a quantum wire structure.

The active layer 242b is formed of a group III-V compound semiconductor and includes a well layer and a barrier layer having a pair structure of any one or more of AlGaN/ AlGaN, InGaN/GaN, InGaN/InGaN, AlGaN/GaN, InAl-GaN/GaN, GaAs(InGaAs)/AlGaAs, and GaP(InGaP)/Al-GaP, but is not limited thereto. At this time, the well layer may be formed of a material having a smaller energy band gap than an energy band gap of the barrier layer.

The second conductive semiconductor layer 242c may be formed of a compound semiconductor. The second conductive semiconductor layer 242c may be formed of a compound semiconductor such as a group III-V or II-VI compound semiconductor and may be doped with a second conductive dopant. The second conductive semiconductor layer 242c may be formed of, for example, a semiconductor material having a composition of $In_xAl_yGa_{1-x-y}N$ ($0 \leq x \leq 1$, $0 \leq y \leq 1$, $0 \leq x+y \leq 1$), i.e. any one or more material selected from among AlGaN, GaNAlInN, AlGaAs, GaP, GaAs, GaAsP, and AlGaInP.

When the second conductive semiconductor layer 242c is a p-type semiconductor layer, the second conductive dopant may be a p-type dopant such as Mg, Zn, Ca, Sr, and Ba. The second conductive semiconductor layer 242c may have a single layer or multi-layer form, without being limited thereto.

Although not illustrated, an electron blocking layer may be disposed between the active layer 242b and the second conductive semiconductor layer 242c. The electron blocking layer may have a superlattice structure. For example, the superlattice structure may include an AlGaN layer doped with a second conductive dopant, or may include a plurality of GaN layers having different aluminum composition ratios that is alternately disposed.

A light transmission conductive layer 245 is disposed on the second conductive semiconductor layer 242c. The light transmission conductive layer 245 may comprise at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IZO nitride (IZON), Al—Ga ZnO (AGZO), In—Ga ZnO (IGZO), Zinc Oxide (ZnO), Iridium Oxide (IrOx), Ruthenium Oxide (RuOx), Nickel Oxide (NiO), RuOx/ITO, and Ni/IrOx/Au(Gold). In addition, when the light transmission conductive layer 245 is provided in consideration of poor contact between the second electrode 244b and the second conductive semiconductor layer 242c, current may be uniformly supplied to the entire second conductive semiconductor layer 242c through the second electrode 244b.

To dispose the first electrode 244a on the first conductive semiconductor layer 242a, a portion of the surface of the first conductive semiconductor layer 242a may be exposed by etching portions of the light transmission conductive layer 245, the second conductive semiconductor layer 242c, the active layer 242b and the first conductive semiconductor layer 242a. As such, the first electrode 244a may be disposed on the exposed surface portion.

A passivation layer 248 may be formed around the light emitting structure 242. The passivation layer 248 may be formed of an insulation material. The insulation material may be a non-conductive oxide or nitride. For example, the passivation layer 248 may be formed of a silicon oxide layer, an oxide nitride layer, or an oxide aluminum layer. In addition, as exemplarily illustrated, the passivation layer 248 is not formed in areas where the first electrode 244a and the second electrode 244b are disposed.

The first electrode 244a and the second electrode 244b of the light emitting device 240 may electrically contact with the first lead frame 220a and the second lead fame 220b respectively via the conductive adhesives 310 and 320. The conductive adhesives 310 and 320 may be formed of a conductive material such as, for example, silver (Ag), gold (Au) or a solder.

The cavity may be filled with the molding part 260 surrounding the light emitting device 240. The molding part 260 may comprise a silicon or epoxy based substance and may contain phosphors 265. The phosphors 265 may be excited by light having a first wavelength emitted from the active layer 242b, thereby emitting light having a second wavelength that is longer than the first wavelength.

The molding part 260 as described above may be formed of the same material as the package body 210 and, thus, assure inter-interface bonding without generation of cracks.

The conductive adhesives 310 and 320 may be formed of a solder or any of other conductive materials and may have the smallest width at a central region thereof as illustrated. Here, the width may mean a diameter when the conductive adhesives 310 and 320 have a circular horizontal cross section and may mean a length when the conductive adhesives 310 and 320 have a square horizontal cross section.

In addition, a height $h0_3$ of the light emitting device 240 may be within a range of about 100 μl to 200 μm, and a height $h_{04}$ of the conductive adhesives 310 and 320 may be 30% to 50% of the height $h_{03}$ of the light emitting device 240, i.e. within a range of about 30 μm to 100 μm.

Figure 4A:
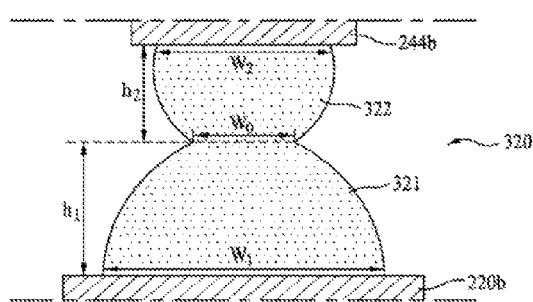
FIGS. 4A and 4B are views illustrating embodiments of a conductive adhesive of FIG. 3.
Figure 4B:
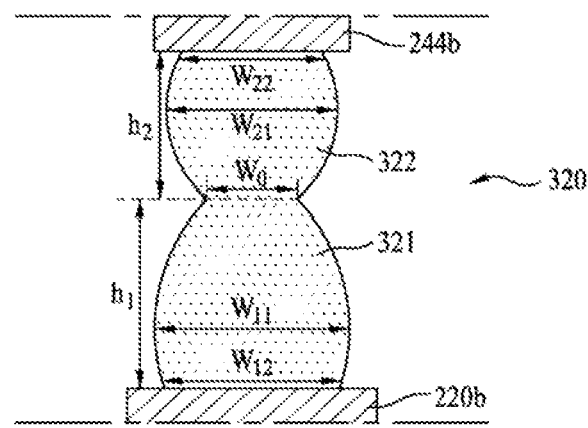

FIGS. 4A and 4B are views illustrating embodiments of the conductive adhesive of FIG. 3. Although one conductive adhesive 320, the second lead frame 220b and the second electrode 244b are illustrated, the following description may be applied to the other conductive adhesive 310, the first lead frame 220a and the first electrode 244a.

In the embodiment illustrated in FIG. 4A, the conductive adhesive 320 includes a first portion 321 and a second portion 322. On the basis of the central region of the solder 320 having the smallest width, a portion toward the second lead frame 220b may be referred to as a first portion 321 and a portion toward the second electrode 244b may be referred to as a second portion 322.

The first portion 321 and the second portion 322 as described above may be formed of the same material, and the central region may be a region where the first portion 321 and the second portion 322 meet each other.

A height $h_1$ of the first portion 321 may be greater than a height $h_2$ of the second portion 322. The end of the first portion 321 may contact with the second lead frame 220b and the end of the second portion 322 may contact with the second electrode 244b. At this time, a width $W_1$ of the end of the first portion 321 contacting with the second lead frame 220b may be greater than a width $W_2$ of the end of the second portion 322 contacting with the second electrode 244b. To stably support the light emitting device during a bonding process to be described below, it is advantageous that the volume, i.e. the height $h_1$ and width $W_1$ of the first portion 331 are greater than the volume, i.e. the height $h_2$ and width $W_2$ of the second portion 322.

In the embodiment illustrated in FIG. 4B, although the conductive adhesive 320 includes the first portion 321 and the second portion 322 as in the embodiment of FIG. 4A, the shapes of the first portion 321 and the second portion 322 may differ from those in the embodiment of FIG. 4A.

In the embodiment of FIG. 4A, each of the first portion 321 and the second portion 322 may have the greatest width $W_1$ or $W_2$ at the end thereof contacting with the second lead frame 220b or the second electrode 244b and may be gradually reduced in width to have the smallest width $W_0$ at the central region.

On the other hand, in the embodiment of FIG. 4B, the first portion 321 may have a width $W_{12}$ at an end thereof contacting with the second lead frame 220b and the second portion 322 may have a width $W_{22}$ at an end thereof contacting with the second electrode 244b. The width of each of the first portion 321 and the second portion 322 may be increased from the width $W_{12}$ or $W_{22}$ and then reduced such that the central region of the conductive adhesive 320 has the smallest width $W_0$.

As will be described below, the first portion 321 and the second portion 322 are separately applied to the second lead frame 220b and the second electrode 244b on the light emitting device 240 and then coupled to each other via a bonding process such that the width $W_{12}$ of the end of the first portion 321 contacting with the second lead frame 220b and the width $W_{22}$ of the end of the second portion 322 contacting with the second electrode 244b are greater than those of bonding surfaces of the first portion 321 and the second portion 322. Therefore, the conductive adhesive 320 may have the smallest width $W_0$ at the central region thereof. Here, when the first portion 321 and the second portion 322 contact with each other, voids that may cause electrical connection defects may be generated at contact surfaces of the first portion 321 and the second portion 322. Providing the central region of the conductive adhesive 320 with the smallest width $W_0$ may minimize generation of voids caused when the first portion 321 and the second portion 322 contact with each other.

In addition, according to the magnitude of the width $W_0$ of the central region, adhesion between the first portion 321 and the second portion 322 may be increased upon bonding of the first portion 321 and the second portion 322, or removal efficiency of voids at an interface between the first portion 321 and the second portion 322 may vary. When the width $W_0$ of the central region is excessively small, a bonding area is reduced, resulting in adhesion deterioration. Therefore, the width $W_0$ of the central region where the first portion 321 and the second portion 322 are bonded to each other may be determined by adjusting pressure applied upon bonding of the first portion 321 and the second portion 322 in consideration of the heights and the widths of the first portion 321 and the second portion 322.

In addition, according to pressure applied when the first portion 321 and the second portion 322 are respectively applied to the second lead frame 220b and the second electrode 244b on the light emitting device 240 or other environmental conditions, each of the first portion 321 and the second portion 322 may have the greatest width $W_1$ or $W_2$ at the end thereof contacting with the second lead frame 220b or the second electrode 244b as exemplarily illustrated in FIG. 4A, or each of the first portion 321 and the second portion 322 may have the smaller width $W_{12}$ or $W_{22}$ at the end thereof contacting with the second lead frame 220b or the second electrode 244b than a width $W_{11}$ or $W_{22}$ at a central region thereof as exemplarily illustrated in FIG. 4B.

Here, the above-described structure in which the width $W_{12}$ of the first portion 321 and the width $W_{22}$ of the second portion 322 are respectively smaller than the width $W_{11}$ of the central region of the first portion 321 and the width $W_{21}$ of the central region of the second portion 322 allows the ends of the first portion 321 and the second portion 322 to be stably connected to the second lead frame 220b and the second electrode 244b after bonding of the first portion 321 and the second portion 322.

In other words, the width $W_{12}$ of the first portion 321 and the width $W_{22}$ of the second portion 322 may be increased beyond the widths of the second lead frame 220b and the second electrode 244b by pressure applied to the first portion 321 and the second portion 322 upon bonding of the first portion 321 and the second portion 322, which may cause the first portion 321 and the second portion 322 to be connected to the outer peripheries of the second lead frame 220b and the second electrode 244b. Accordingly, by forming the first portion 321 and the second portion 322 such that the width $W_{12}$ of the first portion 321 and the width $W_{22}$ of the second portion 322 are respectively smaller than the width $W_{11}$ of the central region of the first portion 321 and the width $W_{21}$ of the central region of the second portion 322, it is possible to prevent the first portion 321 and the second portion 322 from spreading out beyond the widths of the second lead frame 220b and the second electrode 244b when the conductive adhesive 320 spreads out by pressure applied to the first portion 321 and the second portion 322 upon bonding of the first portion 321 and the second portion 322.

In this way, when the first portion 321 and the second portion 322 are connected to the second lead frame 220b and the second electrode 244b, the first portion 321 and the second portion 322 may be maintained at smaller widths than the widths of the second lead frame 220b and the second electrode 244b, which allows the first portion 321 and the second portion 322 to be stably connected to the second lead frame 220b and the second electrode 244b.

At this time, although a region of each of the first portion 321 and the second portion 322 having the greatest width may be referred to as a central region, the central region is not disposed at accurately the center in the vertical direction of each of the first portion 321 and the second portion 322, but are not limited thereto.

In the present embodiment, the width $W_{12}$ of the end of the first portion 321 of the conductive adhesive 320 contacting with the first lead frame 220b may be smaller than the width $W_{11}$ of the central region of the first portion 321 and greater than the width $W_0$ of the central region of the conductive adhesive 320.

In addition, the width $W_{22}$ of the end of the second portion 322 of the conductive adhesive 320 contacting with the second electrode 244b may be smaller than the width $W_{21}$ of the central region of the second portion 322 and greater than the width $W_0$ of the central region of the conductive adhesive 320.

In the embodiments of FIGS. 4A and 4B, the conductive adhesive may be formed as the lower first portion and the upper second portion are coupled to each other, the central region of the conductive adhesive that serves as a coupling interface of the first portion and the second portion may have the smallest width, and the shapes of the first portion and the second portion may be altered in the respective embodiments.

Figure 5A:
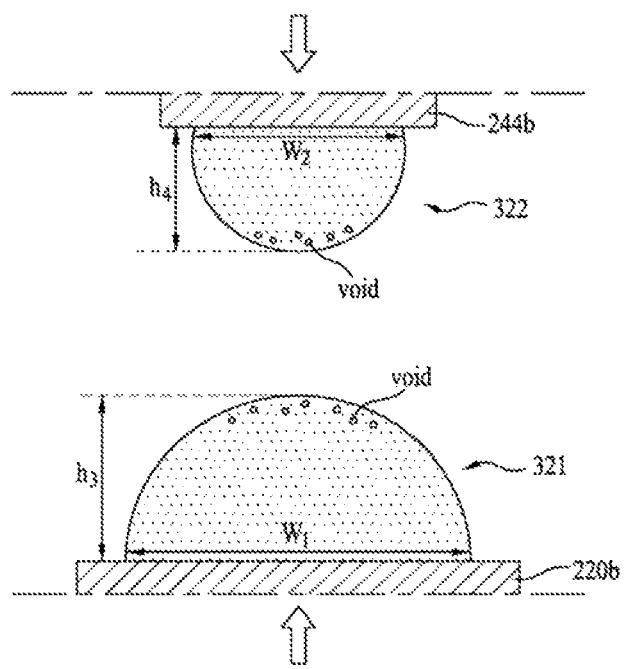
FIGS. 5A to 5C are views illustrating a process of forming the conductive adhesive of FIG. 4A.
Figure 5B:
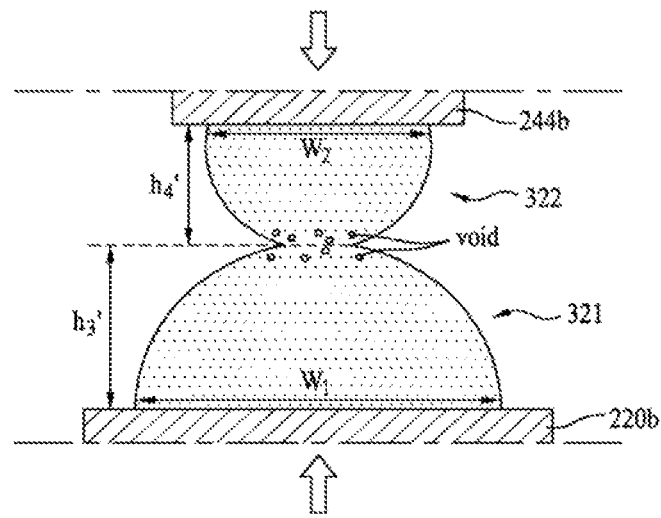
Figure 5C:
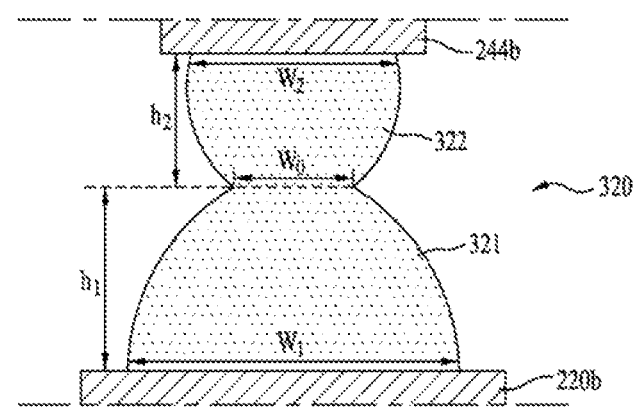

FIGS. 5A to 5C are views illustrating a process of forming the conductive adhesive of FIG. 4A.

In FIG. 5A, the first portion 321 of the conductive adhesive is applied to the second lead frame 220b and the second portion 322 of the conductive adhesive is applied to the second electrode 244b. A height $h_3$ and width $W_1$ of the first portion 321 may be greater than a height $h_4$ and width $W_2$ of the second portion 322. In addition, the size of the first portion 321 may be greater than the size of the second portion 322 because the second portion 322 on the second electrode 244b will be bonded to the first portion 321 on the second lead frame 220b.

In the case where the first portion 321 is applied to the second lead frame 220b and the second portion 322 is applied to the second electrode 244b, it is advantageous that the volume, i.e. the height $h_3$ and width $W_1$ of the first portion 331 are greater than the volume, i.e. the height $h_4$ and width $W_2$ of the second portion 322, in order to stably support the light emitting device in a bonding process of FIG. 5B.

Meanwhile, voids may be generated in the first portion 321 and the second portion 322. Specifically, the voids may be generated near the surface as illustrated when temperature drops.

Then, as exemplarily illustrated in FIG. 5B, the first portion 321 and the second portion 322 may be bonded to each other as the first portion 321 and the second portion 322 are fused and coupled to each other.

The first portion 321 and the second portion 322 may have the smaller heights $h_{3'}$ and $h_{4'}$ than the heights $h_3$ and $h_4$ of FIG. 5A and the widths $W_1$ and $W_2$ equal to the widths of FIG. 5A during coupling or fusion thereof.

Since the overlying light emitting device receives force such as, for example, gravity applied toward the underlying first and second lead frames during the coupling or fusion of the first portion 321 and the second portion 322, the heights $h_{3'}$ and $h_{4'}$ may be smaller than the heights $h_3$ and $h_4$ of FIG. 5A and the widths $W_1$ and $W_2$ may be equal to the widths of FIG. 5A.

FIG. 5C illustrates the conductive adhesive 320 after the coupling of the first portion 321 and the second portion 322 ends, and the conductive adhesive 320 may have the same shape as the conductive adhesive 320 of FIG. 4A.

That is, the first portion 321 and the second portion 322 are coupled to each other and an interface between the first portion 321 and the second portion 322 may be a central region having the smallest width $W_0$. When heat is applied during coupling of the first portion 321 and the second portion 322, some of conductive materials of the surfaces is fused and then recombined, which causes removal of voids. In this way, the conductive adhesive, more particularly, the central region thereof may have a void-free structure.

Although the conductive adhesive is configured as two separate portions in the above-described process, the conductive adhesive may be divided into three or more portions, which may increase the height of the conductive adhesive and reduce transfer of stress to the light emitting device.

The light emitting device package manufactured by the above-described process may achieve improved bonding reliability because the first portion applied to the lead frame and the second portion applied to the electrode are coupled to each other to form the conductive adhesive. In addition, the light emitting device package manufactured by the above-described process may achieve improved luminous efficacy owing to removal of voids in the conductive adhesive and may reduce shock transferred to the light emitting structure formed of a GaN based material because the conductive adhesive, which consists of two portions and has a greater thickness than that of the related art, can alleviate stress caused by use of materials having differential thermal expansion coefficients.

Figure 6:
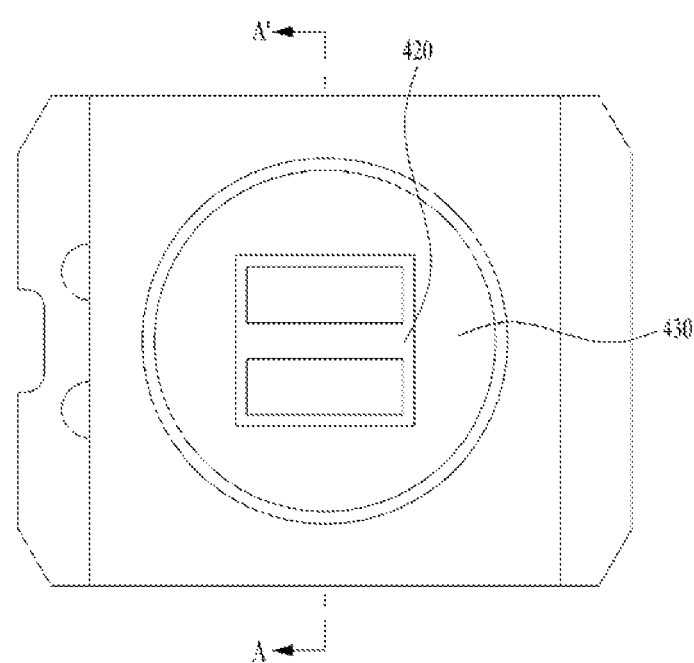
FIG. 6 is a plan view illustrating a second embodiment of a light emitting device package.
Figure 7:
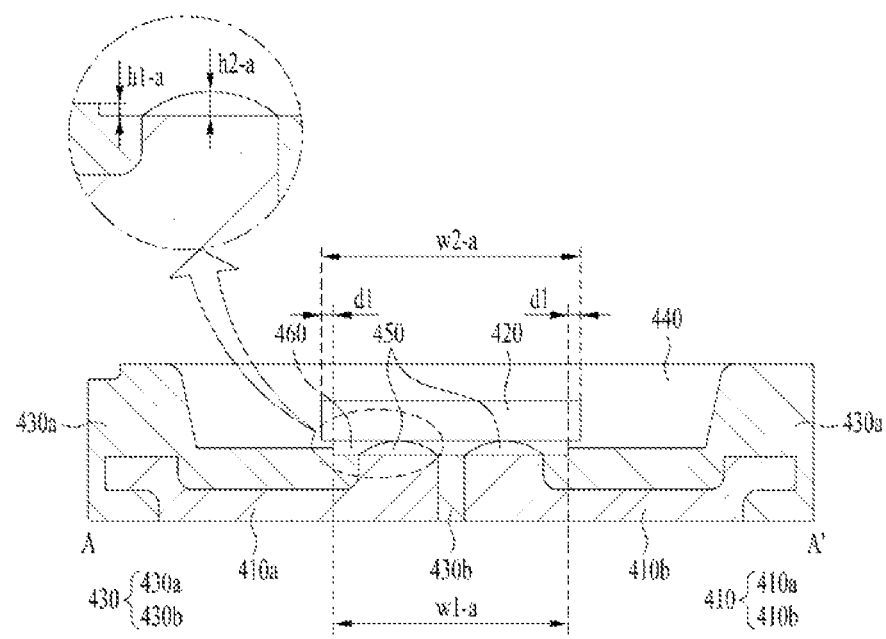
FIG. 7 is a cross sectional view illustrating the embodiment of FIG. 6.

FIG. 6 is a plan view illustrating a second embodiment of a light emitting device package. FIG. 6 illustrates an upper surface of the light emitting device package. FIG. 7 is a cross sectional view taken along line A-A' of the light emitting device package illustrated in FIG. 6.

Referring to FIG. 7, the light emitting device package may include a package body 430, a light emitting device 420, a first lead frame 410a, a second lead frame 410b, and conductive adhesives 450.

The package body 430 may have a cavity 440 and at least one recess 460 formed in the bottom of the cavity 440.

The package body 430 may be formed of a silicon material or a synthetic resin material, and may be formed of a thermosetting resin. For example, the thermosetting resin may be an Epoxy Molding Compound (EMC). When the thermosetting resin is used, damage such as, for example, splitting may be suppressed, which may effectively reduce thermal deformation, adhesion deterioration and yellowing of the package body 430.

In the case where the package body 430 is formed of white silicon or white epoxy molding compound, enhanced luminous intensity may be accomplished via increase in the reflectivity of light emitted from the light emitting device 420.

The cavity 440 of the package body 430 may be defined by the bottom and the sidewall. The package body 430 may include a first region 430a that defines the sidewall and a portion of the bottom of the cavity 440 and a second region 430b between the first lead frame 410a and the second lead frame 410b.

The cavity 440 may have a circular shape, an oval shape, or a polygonal shape (e.g., a rectangular shape) when viewed from the top.

The cavity 440 may have curved corners, and the sidewall of the cavity 440 may be perpendicular to or tilted relative to the bottom of the cavity 440. The sidewall of the cavity 440 serves as a reflective surface to reflect light emitted from the light emitting device 420 toward the upper surface of the light emitting device package. A separate reflective member (not illustrated) may be provided on the bottom of the cavity 440 to reflect light emitted from the light emitting device 420 so as to luminous efficacy, without being limited thereto.

The recess 460 may be formed in the bottom of the cavity 440 defined in the package body 430. The recess 460 may be disposed at the center of the cavity 440.

The light emitting device 420 may be placed at the recess 460 and may be disposed above the recess 460.

As exemplarily illustrated in FIG. 7, the first lead frame 410a and the second lead frame 410b may be spaced apart from each other in the horizontal direction, different from the thickness direction of the package body 430, in the recess 460.

The first lead frame 410a and the second lead frame 410b may include metal substrates and serve to support the light emitting device 420 disposed on the first and second lead frames 410a and 410b and to transmit electrical signals to the light emitting device 420. The first lead frame 410a and the second lead frame 410b may be formed of, for example, copper (Cu), aluminum (Al), silver (Ag), nickel (Ni) or titanium (Ti) and have a single-layer or multi-layer form, without being limited thereto.

The first lead frame 410a and the second lead frame 410b may be spaced apart from each other by a distance d2 of 0.1 mm or more in the horizontal direction. When the distance d2 is below 0.1 mm, the conductive adhesives 450 formed on the respective lead frames 410 are disposed close to each other, which may cause electrical short-circuit.

The first lead frame 410a and the second lead frame 410b may outwardly radiate heat generated in the light emitting device 420 and reflect light emitted from the light emitting device 420 so as to increase luminous efficacy. A separate reflective member (not illustrated) may be disposed on the first lead frame 410a and the second lead frame 410b to reflect light emitted from the light emitting device 420 so as to increase luminous efficacy, without being limited thereto.

Meanwhile, the conductive adhesives 450 may be disposed between the light emitting device 420 and the first and second lead frames 410a and 410b.

The conductive adhesives 450 may function to bond the light emitting device 420 and the first and second lead frames 410a and 410b to each other and to electrically connect the same to an external circuit. The conductive adhesives 450 may have a first height h2-$a$.

The conductive adhesives 450 may comprise a solder paste consisting of a flux serving as a solvent and conductive powder. The first height h2-$a$ of the conductive adhesives 450 may vary according to the viscosity of the solder paste and the amount of the flux. The first height h2-$a$ may be within a range of 30 μm to 100 μm and, more particularly, within a range of 30 μm to 50 μm.

The conductive adhesive 450 serve to bond the lead frames 410a and 410b and the light emitting device 420 to each other and may have the best adhesion when the thickness thereof is within a range of 30 μm to 50 μm after removal of the flux serving as a solvent. When the thickness of the conductive adhesives 450 is below 30 μm, the conductive adhesives 450 cannot achieve required adhesion. When the thickness of the conductive adhesives 450 exceeds 100 μm, the light emitting device 420 may deviate from a fixed position thereof in a reflow process after application of the solder paste.

Referring to FIG. 7, a height h1-$a$ of the recess 460 may be within a range of 30 μm to 100 μm. When the depth h1-$a$ of the recess 460 is below 30 μm, the recess 460 cannot prevent the solder paste from flowing to the periphery of the light emitting device 420 upon formation of the conductive adhesives 450. When the depth h1-$a$ of the recess 460 exceeds 100 μm, the depth h1-$a$ of the recess 460 may be greater than the height h2-$a$ of the conductive adhesives 450, which makes it impossible for the conductive adhesives 450 to connect the light emitting device 420 and the first and second lead frames 410 to each other.

A first width w1-$a$ of the recess 460 in the horizontal direction may be 0.9 times or more and 1.1 times or less of a second width w2-$a$ of the light emitting device 420 in the horizontal direction.

Referring to FIG. 7, the first width w1-$a$ of the recess 460 in the horizontal direction may be smaller than the second width w2-$a$ of the light emitting device in the horizontal direction, and the first width w1-$a$ may be at least 0.9 times or more of the second width w2-$a$.

In an embodiment in which the first width w1-$a$ of the recess 460 is smaller than the second width w2-$a$ of the light emitting device 420, more particularly, the first width w1-$a$ is below 0.9 times of the second width w2-$a$, the conductive adhesives 450 may be reduced in cross sectional area as compared to the light emitting device 420, which may deteriorate adhesion strength between the light emitting device 420 and the first and second lead frames 410.

Figure 8:
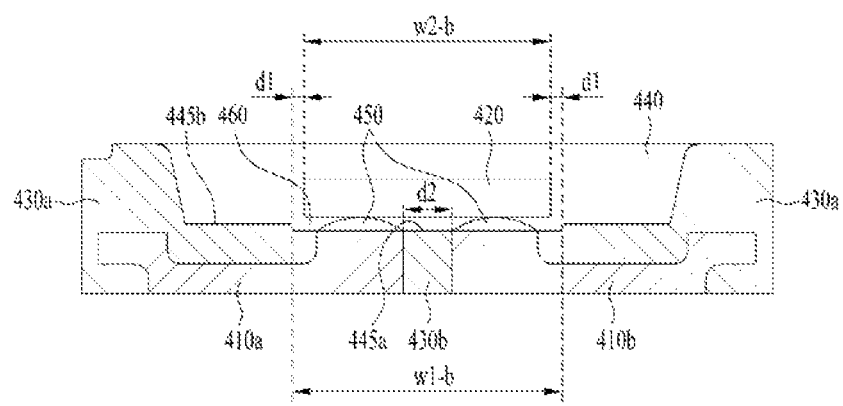
FIG. 8 is a plan view illustrating a third embodiment of a light emitting device package.
Figure 9:
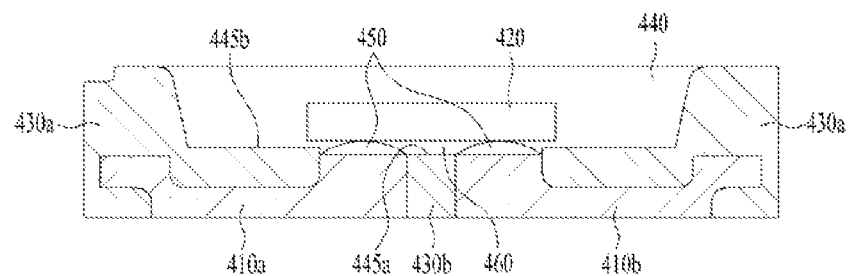
FIG. 9 is a plan view illustrating a fourth embodiment of a light emitting device package.
Figure 10:
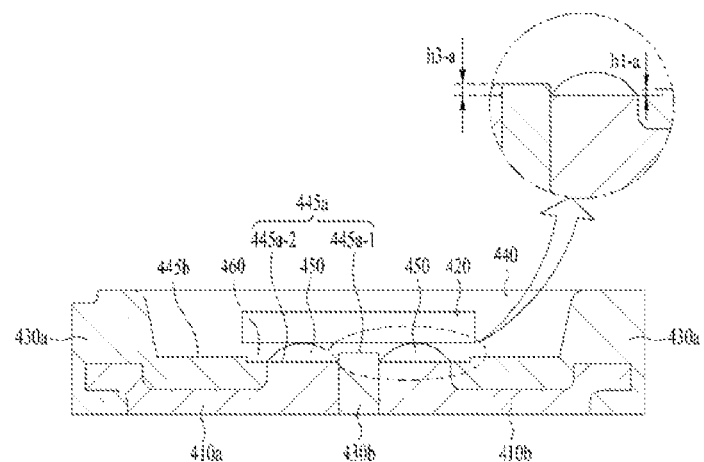
FIG. 10 is a plan view illustrating a fifth embodiment of a light emitting device package.

FIG. 8 is a plan view illustrating a third embodiment of a light emitting device package, FIG. 9 is a plan view illustrating a fourth embodiment of a light emitting device package, and FIG. 10 is a plan view illustrating a fifth embodiment of a light emitting device package.

A redundant description of the same configurations as those of the above-described embodiments will be omitted herein and the following description will be centered on differences.

In the third embodiment of the light emitting device package as exemplarily illustrated in FIG. 8, a first width w1-$b$ of the recess 460 may be greater than a second width w2-$b$ of the light emitting device 420 and the first width w1-$b$ may be at most 1.1 times or less.

In the case where the first width w1-$b$ of the recess 460 is greater than the second width w2-$b$ of the light emitting device 420, more particularly, the first width w1-*b* exceeds 1.1 times of the second width w2-*b*, the area of the conductive adhesive 450 exposed around the light emitting device 420 is increased, which may deteriorate luminous efficacy.

Although not illustrated in FIG. 8, in the embodiment of the light emitting device package, a first virtual vertical line extending from the side edge of the light emitting device 420 in the thickness direction of the light emitting device 420 may overlap with a second virtual vertical line extending from the boundary of the recess 460 in the thickness direction. For example, the light emitting device 420 and the recess 460 may have the same horizontal width.

Referring to FIGS. 8 and 9, the cavity 440 may have a first bottom surface 445*a* provided with the recess 460 and a second bottom surface 445*b* adjacent to the first bottom surface 445*a*. For example, the first bottom surface 445*a* may be a bottom surface of the recess 460. The conductive adhesives 450 may be disposed on the first bottom surface 445*a*.

The first lead frame 410*a* and the second lead frame 410*b* may penetrate the package body 430 in the thickness direction and be exposed from a portion of the first bottom surface 445*a*. The first lead frame 410*a* and the second lead frame 410*b* may be spaced apart from each other so as to be electrically separated from each other. The first lead frame 410*a* and the second lead frame 410*b* may be separated from each other by the second region 430*b* of the package body 430.

Referring to the embodiment illustrated in FIG. 8, the first lead frame 410*a* and the second lead frame 410*b* may be horizontally spaced apart from the boundary between the first bottom surface 445 and the second bottom surface 445*b* to thereby be exposed.

For example, in the embodiment illustrated in FIG. 8, the recess 460 may be defined by a stepped portion between the first bottom surface 445*a* and the second bottom surface 445*b* and the stepped portion may be formed at a region of the package body 430 of the bottom surface of the cavity 440.

The stepped portion formed at the package body 430 may be acquired by injection molding such that a portion of the first region 430*a* of the package body 430 corresponding to the second bottom surface 445*b* of the cavity 440 is disposed higher than the remaining portion.

In the fourth embodiment of the light emitting device package illustrated in FIG. 9, the boundary between the first bottom surface 445*a* and the second bottom surface 445*b* may contact with the exposed first and second lead frames 410*a* and 410*b*.

For example, the side portion of the first lead frame 410*a* adjacent to the first region 430*a* of the package body 430 may contact with the boundary between the first bottom surface 445*a* and the second bottom surface 445*b*. That is, the stepped portion between the first bottom surface 445*a* and the second bottom surface 445*b* defining the recess 460 in the embodiment of FIG. 9 may be formed at a plane where the first region 430*a* of the package body 430 contacts with the first lead frame 410*a* and the second lead frame 410*b*.

The recess 460 defined by the stepped portion between the first bottom surface 445*a* and the second bottom surface 445*b* may be formed such that the first and second lead frames 410 corresponding to the first bottom surface 445*a* and the second region 430*b* of the package body 430 are disposed lower than the second bottom surface 445*b*.

Referring to FIG. 10 illustrating the fifth embodiment of the light emitting device package, the first bottom surface 445*a* of the cavity 440 may include a first region 445*a*-1 corresponding to the second region 430*b* of the package body between the first lead frame 410*a* and the second lead frame 410*b* and the remaining second region 445*a*-2 except for the first region 445*a*-1. The first region 445*a*-1 of the first bottom surface 445*a* may protrude than the second region 445*a*-2.

For example, a protruding height h3-*a* of the first region 445*a*-1 from the second region 445*a*-2 may be within a range of 30 μm to 100 μm. When the protruding height h3-*a* is below 30 μm, this may cause insufficient separation of the conductive adhesives 450 formed respectively on the first lead frame 410*a* and the second lead frame 410*b*. When the protruding height h3-*a* exceeds 100 μm, scattering or absorption of light emitted from the light emitting device 430 may occur, thus causing deterioration in luminous efficacy.

The light emitting device package manufactured by the above-described process may include the recess formed in the bottom of the cavity to prevent the conductive adhesives from flowing out of the recess and from protruding to the periphery of the light emitting device, which may reduce light loss of the package.

Figure 11:
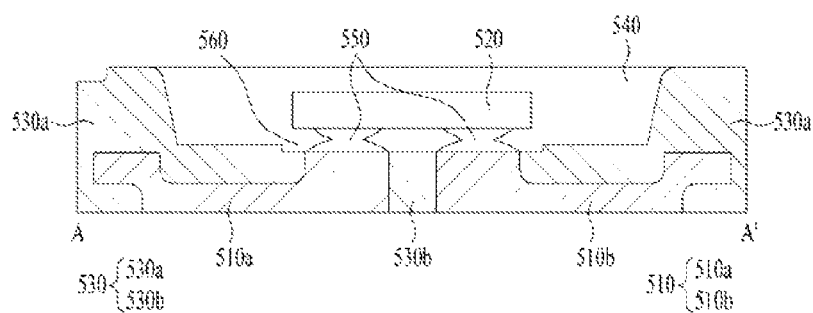
FIG. 11 is a plan view illustrating a sixth embodiment of a light emitting device package.

FIG. 11 is a plan view illustrating a sixth embodiment of a light emitting device package.

Referring to FIG. 11, the light emitting device package may include a package body 530, a light emitting device 520, a first lead frame 510*a*, a second lead frame 510*b*, and conductive adhesives 550.

The package body 530 may have a cavity 540 and at least one recess 560 formed in the bottom of the cavity 540.

The package body 530 may be formed of a silicon material or a synthetic resin material, and may be formed of a thermosetting resin. For example, the thermosetting resin may be an Epoxy Molding Compound (EMC). When the thermosetting resin is used, damage such as, for example, splitting may be suppressed, which may effectively reduce thermal deformation, adhesion deterioration and yellowing of the package body 530.

In the case where the package body 530 is formed of white silicon or white epoxy molding compound, enhanced luminous intensity may be accomplished via increase in the reflectivity of light emitted from the light emitting device 520.

The cavity 540 of the package body 530 may be defined by the bottom and the sidewall. The package body 530 may include a first region 530*a* that defines the sidewall and a portion of the bottom of the cavity 540 and a second region 530*b* between the first lead frame 510*a* and the second lead frame 510*b*.

The cavity 540 may have a circular shape, an oval shape, or a polygonal shape (e.g., a rectangular shape) when viewed from the top.

The cavity 540 may have curved corners, and the sidewall of the cavity 440 may be perpendicular to or tilted relative to the bottom of the cavity 440. The sidewall of the cavity 540 serves as a reflective surface to reflect light emitted from the light emitting device 520 toward the upper surface of the light emitting device package. A separate reflective member (not illustrated) may be provided on the bottom of the cavity 540 to reflect light emitted from the light emitting device 520 so as to luminous efficacy, without being limited thereto.

The recess 560 may be formed in the bottom of the cavity 540 defined in the package body 530. The recess 560 may be disposed at the center of the cavity 540.

The light emitting device 520 may be placed at the recess 560 and may be disposed above the recess 560.

As exemplarily illustrated in FIG. 11, the first lead frame 510a and the second lead frame 510b may be spaced apart from each other in the horizontal direction, different from the thickness direction of the package body 530, in the recess 560.

Meanwhile, the conductive adhesives 550 may be disposed between the light emitting device 520 and the first and second lead frames 510a and 510b.

The conductive adhesives 550 may function to bond the light emitting device 520 and the first and second lead frames 510a and 510b to each other and to electrically connect the same to an external circuit. In addition, the conductive adhesives 550 may be formed of a conductive material such as, for example, silver (Ag), gold (Au) or a solder.

Here, each conductive adhesive 550 may have a central region as illustrated and be divided into a first portion and a second portion with the central region disposed therebetween. The central region of the conductive adhesive 550 may have the smallest width. Here, the width may mean a diameter when the conductive adhesives 550 have a circular horizontal cross section and may mean a length when the conductive adhesives 550 have a square horizontal cross section.

In addition, the conductive adhesives may have a shape or structure as illustrated in FIGS. 4A to 5C and be disposed between the light emitting device and the first and second lead frames. Although the conductive adhesives of the embodiments illustrated in FIGS. 7 to 11 are illustrated as the width of contact surfaces of the conductive adhesives contacting with the first lead frame and the second lead frame being equal to the width of the first lead frame and the second lead frame, as exemplarily illustrated in FIGS. 4A to 5C, the conductive adhesives may be disposed such that the width of contact surfaces of the conductive adhesives contacting with the first lead frame and the second lead frame is smaller than the width of the first lead frame and the second lead frame.

The light emitting device packages of the embodiments may have a flip chip bonding structure.

The light emitting device packages as described above include a recess formed in the bottom of a cavity to prevent a conductive adhesive from flowing out of the recess and protruding to the periphery of a light emitting device, which may reduce light loss of the package. In addition, light emitting device packages as described above may achieve improved bonding reliability owing to the smallest width of a central region of the conductive adhesive disposed between a lead frame and an electrode of the light emitting device, may achieve enhanced luminous efficacy through removal of voids in the conductive adhesive, and may reduce shock transferred to a light emitting structure formed of a GaN based material because the conductive adhesive, which consists of two portions and has a greater thickness than that of the related art, can alleviate stress caused by use of materials having differential thermal expansion coefficients.

Hereinafter, an image display apparatus and a lighting apparatus will be described as one embodiment of a lighting system provided with the light emitting device package as described above.

Figure 12:
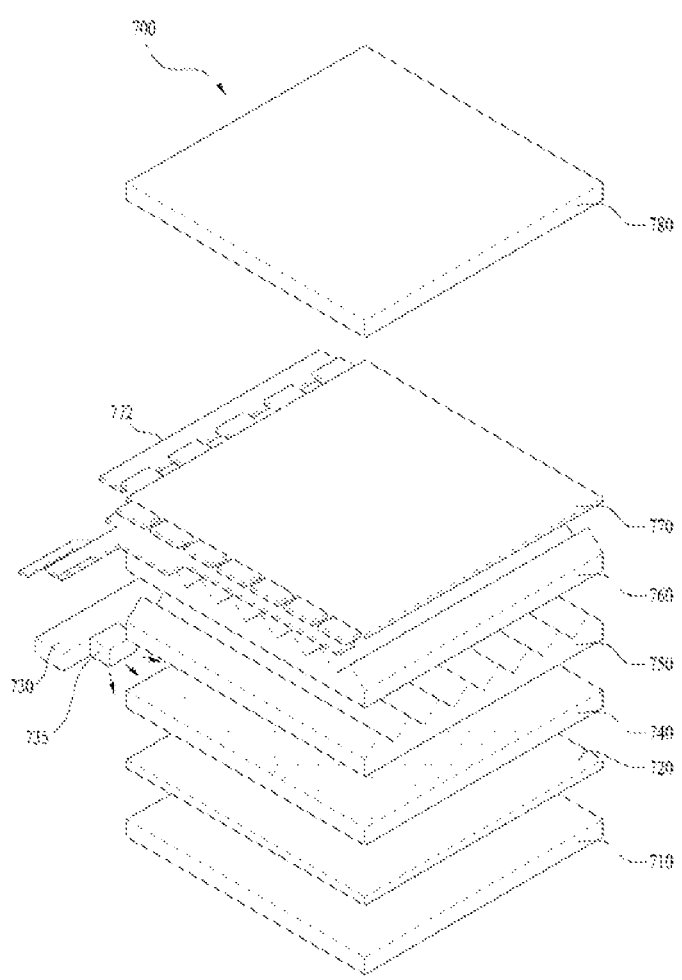
FIG. 12 is a view illustrating one embodiment of an image display apparatus including a light emitting device package.

FIG. 12 is a view illustrating one embodiment of the image display apparatus.

As exemplarily illustrated in FIG. 12, the image display apparatus 700 of the present embodiment includes a light source module, a reflector 720 on a bottom cover 710, a light guide panel 740 disposed in front of the reflector 720 to guide light, emitted from the light source module, forward of the image display apparatus 700, a first prism sheet 750 and a second prism sheet 760 disposed in front of the light guide panel 740, a panel 770 disposed in front of the second prism sheet 760, and a color filter 780 disposed in front of the panel 770.

The light source module includes a light emitting device package 735 on a circuit board 730. Here, the circuit board 730 may be a PCB, for example, and the light emitting device package 735 is as described above.

The bottom cover 710 may receive constituent elements of the image display apparatus 700. The reflector 720 may be a separate element as exemplarily illustrated in FIG. 12, or may be a high reflectivity material coated on a back surface of the light guide panel 740 or a front surface of the bottom cover 710.

The reflector 720 may be formed of a material which has high reflectivity and is formed into an ultra thin shape. The reflector 720 may be formed of polyethylene terephthalate (PET).

The light guide panel 740 may scatter light emitted from the light module to allow the light to be uniformly distributed throughout the entire screen of the image display apparatus 700. Thus, the light guide panel 740 may be formed of a material having a good index of refraction and light transmissivity, for example, polymethylmethacrylate (PMMA), polycarbonate (PC), or polyethylene (PE). In addition, when the light guide panel 740 is omitted, an air guide type display apparatus may be implemented.

The first prism sheet 750 includes a support film and a light-transmitting elastic polymer material formed on one surface of the support film. The polymer material may form a prism layer in which a plurality of 3-dimensional patterns is repeated. Here, the plurality of patterns may be stripe patterns consisting of ridges and valleys repeatedly formed as illustrated.

The direction of ridges and valleys formed on one surface of the support film of the second prism sheet 760 may be perpendicular to the direction of the ridges and valleys formed on one surface of the support film of the first prism sheet 750. This allows light transmitted from the light source module and the reflector to be uniformly distributed throughout the panel 770.

In the present embodiment, the first prism sheet 750 and the second prism sheet 760 serve as optical sheets. As examples of other combinations of optical sheets, a micro-lens array, a combination of a diffusive sheet and a micro-lens array, or a combination of a single prism sheet and a micro-lens array may be provided.

The panel 770 may be a liquid crystal display panel, or may be other kinds of display devices requiring a light source.

The panel 770 includes liquid crystals disposed between glass bodies, and a polarizer is disposed on either glass body for utilization of polarity of light. Here, the liquid crystals have intermediate properties between liquid and solid, and are organic molecules having fluidity like a liquid. Thus, the panel 770 displays an image using properties of liquid crystals in which a regular molecular arrangement is changed by an external electric field.

The liquid crystal display panel used in the display apparatus is an active matrix type and employs a transistor as a switch to regulate voltage to be supplied to each pixel.

The color filter 780 may be disposed on a front surface of the panel 770 to transmit only red, green, and blue light on a per pixel basis among the light emitted from the panel 770, thereby enabling display of an image.

Figure 13:
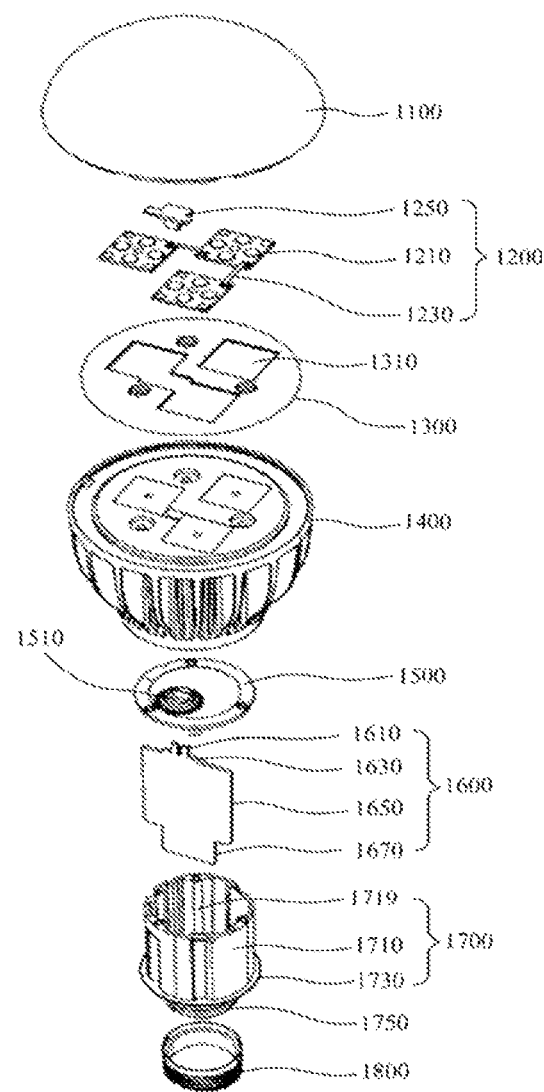
FIG. 13 is a view illustrating one embodiment of a lighting apparatus including a light emitting device package.

FIG. 13 is a view illustrating one embodiment of a lighting apparatus including a light emitting device package.

The lighting apparatus of the present embodiment may include a cover 1100, a light source module 1200, a radiator 1400, a power supply unit 1600, an inner case 1700, and a socket 1800. In addition, the lighting apparatus according to the present embodiment may further include at least one of a member 1300 and a holder 1500, and the light source module 1200 may include the light emitting device package according to the above described embodiments.

The cover 1100 may take the form of a hollow bulb or semi-sphere having an opening. The cover 1100 and the light source module 1200 may be optically coupled to each other. For example, the cover 1100 may diffuse, scatter, or excite light emitted from the light source module 1200. The cover 1100 may be an optical member. The cover 1100 may be coupled to the radiator 1400, and may have a coupling portion for coupling with the radiator 1400.

An inner surface of the cover 1100 may be coated with an ivory white paint. The ivory white paint may contain a diffuser to diffuse light. The surface roughness of the inner surface of the cover 1100 may be greater than the surface roughness of an outer surface of the cover 1100. This serves to sufficiently scatter and diffuse light emitted from the light source module 1200 so as to emit the light to the outside.

The cover 1100 may be formed of glass, plastic, polypropylene (PP), polyethylene (PB), and polycarbonate (PC), for example. Here, polycarbonate is advantageous to achieve excellent light-resistance, heat-resistance, and mechanical strength. The cover 1100 may be transparent such that the light source module 1200 can be seen from the outside, or may be opaque. The cover 1100 may be formed via blow molding.

The light source module 1200 may be disposed on a surface of the radiator 1400. Thus, heat from the light source module 1200 is transferred to the radiator 1400. The light source module 1200 may include a plurality of light emitting device packages 1210, connection plates 1230, and a connector 1250.

The member 1300 is disposed on an upper surface of the radiator 1400, and has guide recesses 1310 for insertion of the light emitting device packages 1210 and the connector 1250. The guide recesses 1310 correspond to boards of the light emitting device packages 1210 and the connector 1250 in a one to one ratio.

A reflective material may be applied to or coated over a surface of the member 1300. For example, a white paint may be applied to or coated over the surface of the member 1300. The member 1300 reflects light, reflected from the inner surface of the cover 1100 to the light-source module 1200, to return the light to the cover 1100. As such, the lighting apparatus according to the present embodiment may achieve enhanced light efficiency.

The member 1300 may be formed of an insulating material, for example. The connection plates 1230 of the light source module 1200 may be formed of an electrically conductive material. As such, electric contact between the radiator 1400 and the connection plates 1230 may be accomplished. The member 1300 may be formed of an insulating material to prevent electrical short-circuit between the connection plates 1230 and the radiator 1400. The radiator 1400 may radiate heat from the light source module 1200 and heat from the power supply unit 1600.

The holder 1500 is configured to close a receiving recess 1719 defined by an insulating portion 1710 of the inner case 1700. As such, the power supply unit 1600, received inside the insulating portion 1710 of the inner case 1700, is hermetically sealed. The holder 1500 has a guide protrusion 1510. The guide protrusion 1510 has a hole for penetration of a protrusion 1610 of the power supply unit 1600.

The power supply unit 1600 processes or converts an external electrical signal to transmit the same to the light source module 1200. The power supply unit 1600 is received in the receiving recess 1719 of the inner case 1700, and is hermetically sealed in the inner case 1700. The power supply unit 1600 may include the protrusion 1610, a guide portion 1630, a base 1650, and an extension portion 1670.

The guide protrusion 1630 is configured to protrude outward from one side of the base 1650. The guide portion 1630 may be inserted into the holder 1500. A plurality of elements may be disposed on one surface of the base 1650. The elements, for example, may be a DC converter to convert AC power from an external power source into DC power, a drive chip to control driving of the light source module 1200, and an Electro-Static Discharge prevention element to protect the light source module 1200, but are not limited thereto.

The extension portion 1670 is configured to protrude outward from the other side of the base 1650. The extension portion 1670 is inserted into a connection portion 1750 of the inner case 1700 to receive an electrical signal from an external source. For example, the width of the extension portion 1670 may be equal to or less than the width of the connection portion 1750 of the inner case 1700. The extension portion 1670 may be electrically connected to one end of a positive electrical wire or a negative electrical wire, and the other end of the positive electrical wire or the negative electrical wire may be electrically connected to the socket 1800.

The inner case 1700 may include a molding part as well as the power supply unit 1600 therein. The molding part is formed of harden molding liquid, and may serve to fix the power supply unit 1600 within the inner case 1700.

As is apparent from the above description, a light emitting device package according to any of the above-described embodiments has the effects of achieving improved bonding reliability because a first portion applied to a lead frame and a second portion applied to an electrode are coupled to each other to form the conductive adhesive, of achieving improved luminous efficacy owing to removal of voids in the conductive adhesive, and of reducing shock transferred to a light emitting structure formed of a GaN based material because the conductive adhesive, which consists of the two portions and has a greater thickness than that of the related art, can alleviate stress caused by use of materials having differential thermal expansion coefficients.

In addition, by providing a recess in the bottom of a cavity, the light emitting device package has the effect of preventing the conductive adhesives from flowing out of the recess and from protruding to the periphery of a light emitting device, which may reduce light loss of the package.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a package body;
   a first lead frame and a second lead frame disposed on the package body; and
   a light emitting device electrically connected to the first lead frame and the second lead frame via respective conductive adhesives,
   wherein at least one of the conductive adhesives has the smallest width at a central region thereof.

2. The package according to claim 1, wherein each of the conductive adhesives is divided into a first portion and a second portion, and the central region is disposed between the first portion and the second portion.

3. The package according to claim 2, wherein an end of the first portion of the conductive adhesive contacts with one of the first lead frame and the second lead frame and an end of the second portion of the conductive adhesive contacts with a first electrode or a second electrode of the light emitting device.

4. The package according to claim 2, wherein the first portion has a higher height than a height of the second portion.

5. The package according to claim 3, wherein the end of the first portion of the conductive adhesive contacting with one of the first lead frame and the second lead frame has a greater width than a width of the end of the second portion contacting with the first electrode or the second electrode of the light emitting device.

6. The package according to claim 3, wherein the end of the first portion of the conductive adhesive contacting with one of the first lead frame and the second lead frame has a smaller width than a width of a central region of the first portion of the conductive adhesive.

7. The package according to claim 6, wherein the end of the first portion of the conductive adhesive contacting with one of the first lead frame and the second lead frame has a greater width than a width of the central region of the conductive adhesive.

8. The package according to claim 3, wherein the end of the second portion of the conductive adhesive contacting with one of the first electrode and the second electrode has a smaller width than a width of a central region of the second portion of the conductive adhesive.

9. The package according to claim 8, wherein the end of the second portion of the conductive adhesive contacting with one of the first electrode and the second electrode has a greater width than a width of the central region of the conductive adhesive.

10. The package according to claim 2, wherein the central region is a coupling interface of the first portion and the second portion.

11. The package according to claim 1, wherein the central region is a void free region.

12. A light emitting device package comprising:
    a package body;
    a first lead frame and a second lead frame arranged on the package body; and
    a light emitting device electrically connected to the first lead frame and the second lead frame via respective conductive adhesives,
    wherein each of the conductive adhesives is divided into a first portion and a second portion, a coupling interface is disposed between the first portion and the second portion, and the coupling interface is a void free region, and
    wherein at least one of the first lead frame and the second lead frame has a concave portion and the package body is disposed in the concave portion.

13. The package according to claim 12, wherein an end of the first portion of the conductive adhesive comes into contact with one of the first lead frame and the second lead frame and an end of the second portion of the conductive adhesive comes into contact with a first electrode or a second electrode of the light emitting device.

14. The package according to claim 12, wherein a width of the second electrode is greater than a width of an end region of the second portion of the conductive adhesive, and the end region contacts with the second electrode.

15. The package according to claim 12, wherein a width of the second lead frame is greater than a width of an end region of the first portion of the conductive adhesive, and the end region contacts with the second lead frame.

16. The package according to claim 12, wherein a width of the coupling interface is smaller than a width of an end region of the first portion of the conductive adhesive, and the end region contacts with the second lead frame.

17. The package according to claim 12, wherein a width of the coupling interface is smaller than a width of an end region of the second portion of the conductive adhesive, and the end region contacts with the second electrode.

18. The package according to claim 12, wherein a width of the coupling interface is smaller than a width of a center region of the first portion of the conductive adhesive and a width of a center region of the second portion of the conductive adhesive.

19. A light emitting device package comprising:
    a package body;
    a first lead frame and a second lead frame arranged on the package body; and
    a light emitting device electrically connected to the first lead frame and the second lead frame via respective conductive adhesives,
    wherein each of the conductive adhesives has the smallest width at a central region thereof, and a height of the central region of one conductive adhesive is different from a height of the central region of another conductive adhesive.

* * * * *